US010971559B2

(12) United States Patent
Yamashita et al.

(10) Patent No.: US 10,971,559 B2
(45) Date of Patent: Apr. 6, 2021

(54) DISPLAY DEVICE

(71) Applicant: FUNAI ELECTRIC CO., LTD., Osaka (JP)

(72) Inventors: Hiroshi Yamashita, Osaka (JP); Makoto Nameda, Osaka (JP)

(73) Assignee: FUNAI ELECTRIC CO., LTD., Osaka (JP)

( * ) Notice: Subject to any disclaimer, the term of this patent is extended or adjusted under 35 U.S.C. 154(b) by 0 days.

(21) Appl. No.: 16/659,575

(22) Filed: Oct. 22, 2019

(65) Prior Publication Data

US 2020/0127057 A1 Apr. 23, 2020

(30) Foreign Application Priority Data

Oct. 23, 2018 (JP) .............................. JP2018-198858

(51) Int. Cl.
*H01L 27/32* (2006.01)
*G02F 1/1362* (2006.01)

(52) U.S. Cl.
CPC .......... *H01L 27/322* (2013.01); *G02F 1/1362* (2013.01); *G02F 2001/136222* (2013.01); *G02F 2201/52* (2013.01)

(58) Field of Classification Search
CPC ........ G06T 11/0011; G09G 5/06; G09G 5/10; G09G 3/2003; G09G 3/2074; G02F 1/133514; G02F 1/1362; G02F 2001/136222; G02F 2201/52; H01L 27/322
USPC ................................................ 349/106–109
See application file for complete search history.

(56) References Cited

U.S. PATENT DOCUMENTS

| | | | |
|---|---|---|---|
| 8,817,120 B2* | 8/2014 | Silverstein | G06T 5/005 348/208.14 |
| 2004/0100570 A1* | 5/2004 | Shizukuishi | H01L 27/14623 348/272 |
| 2005/0253795 A1 | 11/2005 | Moriya et al. | |
| 2007/0085863 A1* | 4/2007 | Moriya | G09G 3/3607 345/694 |
| 2008/0030660 A1* | 2/2008 | Roth | G09G 3/3611 349/106 |
| 2008/0112069 A1* | 5/2008 | Helber | H01L 27/322 359/891 |
| 2008/0316235 A1* | 12/2008 | Okazaki | G02F 1/133514 345/694 |

(Continued)

FOREIGN PATENT DOCUMENTS

JP 2007240659 9/2007

OTHER PUBLICATIONS

Jan Morovic; "5 Overview of Gamut Mapping", Color Gamut Mapping, John Wiley & sons, Incorporated, Jan. 1, 2008, pp. 91-109.

*Primary Examiner* — Charles S Chang
(74) *Attorney, Agent, or Firm* — JCIPRNET

(57) ABSTRACT

A display device capable of expanding a reproducible color gamut range while suppressing a decrease in image brightness is provided. The display device includes a display portion in which first groups and second groups are disposed to line up regularly with each other. The first groups include red color filters, blue color filters and first green color filters, and the second groups include the red color filters, the blue color filters and second green color filters. The second group is equal to the first groups in number of color filters and different from the first groups in filter combination.

7 Claims, 13 Drawing Sheets

(56) References Cited

U.S. PATENT DOCUMENTS

| | | | | |
|---|---|---|---|---|
| 2010/0013748 | A1* | 1/2010 | Cok | H04N 9/67 |
| | | | | 345/83 |
| 2012/0287143 | A1 | 11/2012 | Brown Elliott | |
| 2015/0213748 | A1* | 7/2015 | Park | G09G 3/2003 |
| | | | | 345/55 |
| 2017/0186922 | A1* | 6/2017 | Kim | C09K 11/703 |

* cited by examiner

DISPLAY DEVICE

CROSS REFERENCE TO RELATED APPLICATIONS

This application claims the priority benefit of Japanese Patent Application No. 2018-198858, filed on Oct. 23, 2018. The entirety of the above-mentioned patent application is hereby incorporated by reference herein and made a part of this specification.

BACKGROUND OF THE DISCLOSURE

Technical Field

The disclosure relates to a display device, in particular, to a display device including red color filters, blue color filters, first green color filters, and second green color filters.

Related Art

Conventionally, a display device including red color filters, blue color filters, first green color filters, and second green color filters is known (for example, see patent literature 1: Japanese Patent Application Laid-Open No. 2007-240659).

In patent literature 1, a display device having a display portion in which groups including a plurality of color filters respectively corresponding to four or more colors is disclosed. In the display device described in patent literature 1, color combinations of the color filters are the same in all of the groups including the plurality of color filters. Besides, in the display device described in patent literature 1, one group including the plurality of color filters corresponds to one pixel.

In patent literature 1, an example is shown in which the group of the color filters is configured by the color filters of five colors which are red, blue, green, emerald green, and white. In this case, since the color filters include the red, blue, green, emerald green, and white color filters, a color gamut range that can be reproduced by combinations of the color filters expands compared with a case in which the red, blue, green, and white color filters are included but the emerald green color filters are not included. Besides, emerald green is a color that is relatively close to green and has a hue closer to the blue side than green.

However, in the conventional display device as described in patent literature 1, the color combinations of the color filters are the same in all of the groups of the color filters, and thus green and emerald green that has a hue relatively close to green are disposed in all the groups. Accordingly, in the conventional display device as described in patent literature 1, the reproducible color gamut range can be expanded, but the number of the color filters included in one group tends to increase, and thus an area of each color filter tends to decrease.

Here, in a liquid crystal display (LCD), the image brightness is a value substantially proportional to the area of the color filter. That is, in the LCD, when the backlight brightness is constant, the image brightness decreases along with a reduction in the area of the color filter. In addition, in a white OLED+color filter type display device (WOLED: White OLED) in which a white organic LED (OLED: Organic Light Emitting Diode) and the color filter are combined, the image brightness is a value substantially proportional to a current applied to the white OLED. Then, in the WOLED, the area of the white OLED substantially corresponds to the area of the organic LED corresponding to each white OLED. In addition, since the current density applied to the white OLED has an effect on the life (brightness life) of the white OLED, it is common to change the current value so as not to change the current density when the area of the color filter is changed. That is, in the WOLED, along with the reduction in the area of the color filter, the current applied to the white OLED is reduced, and the brightness decreases accordingly. Therefore, in the conventional display device as described in patent literature 1, the brightness of the displayed image decreases due to the reduction in the area of each color filter for expanding the reproducible color gamut range.

The disclosure provides a display device capable of expanding a reproducible color gamut range while suppressing a decrease in image brightness.

SUMMARY

According to one embodiment of the disclosure, a display device is provided to include: color filters including red color filters, blue color filters, first green color filters used for a first green, and second green color filters used for a second green having a hue closer to a blue side than the first green; and a display portion in which the color filters are disposed. First groups and second groups are disposed to line up regularly with each other in the display portion. The first groups include the red color filters, the blue color filters and the first green color filters, the second groups include the red color filters, the blue color filters and the second green color filters, and the second group is equal to the first group in number of the color filters and is different from the first groups in filter combination.

DESCRIPTION OF THE EMBODIMENTS

Embodiments that embody the disclosure are described below with reference to the drawings.

First Embodiment

A configuration of a display device 100 of the first embodiment of the disclosure is described with reference to FIGS. 1-5.

Figure 1:
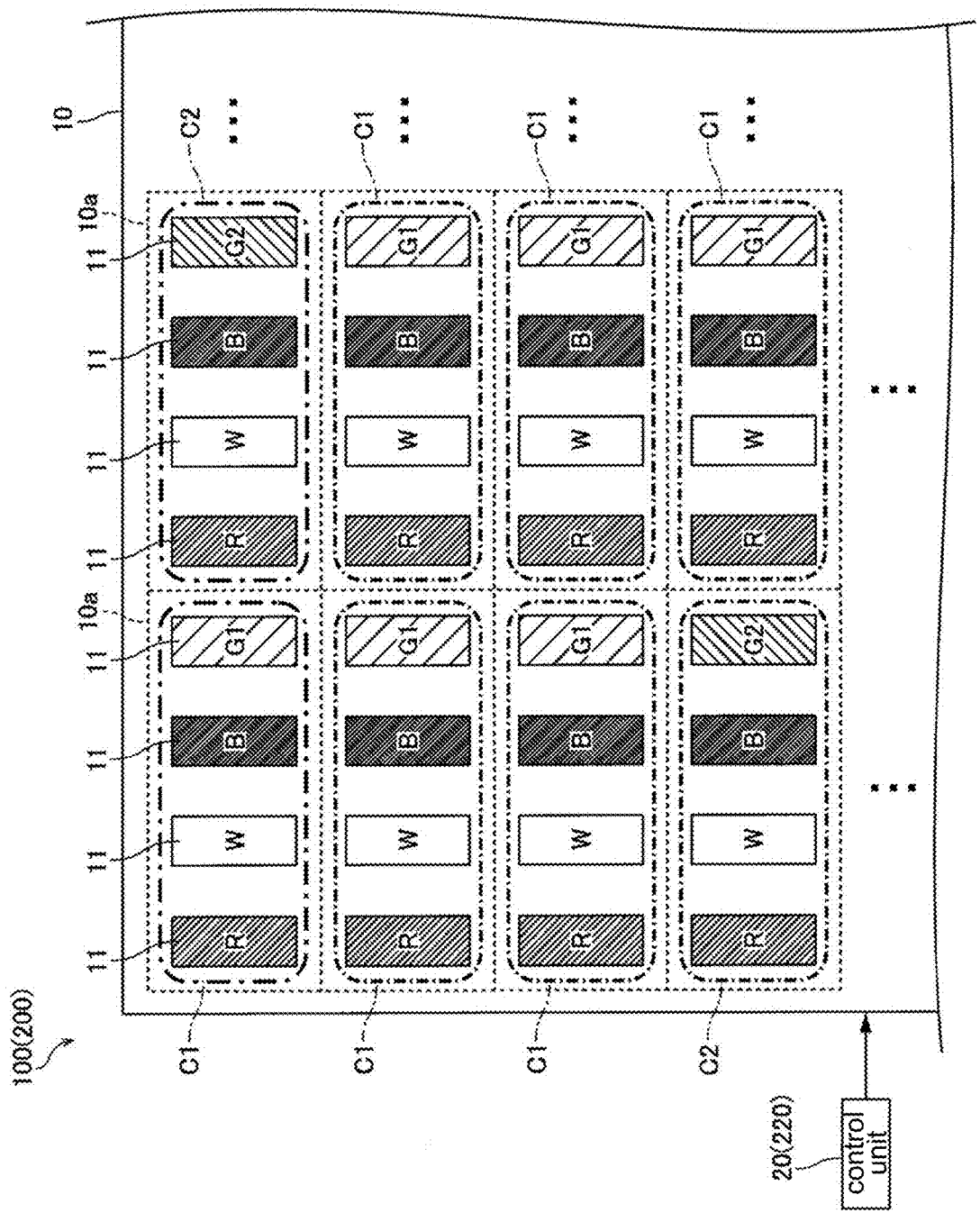
FIG. 1 is a diagram illustrating an arrangement of color filters of a display device of a first embodiment.

As shown in FIG. 1, the display device 100 is an image display device for displaying a color image. The display device 100 includes a display portion 10 in which color filters 11 are disposed. In the display device 100, four color filters 11 are disposed in each pixel 10a. The display device 100 is configured so that the amount of light that is emitted from backlight (not shown) and passes through the color filters 11 is adjusted for each of the color filters 11 having different light transmission properties (transmitted wavelength bands), and thereby a desired color is reproduced. That is, the display device 100 is a liquid crystal display (LCD).

The color filters 11 include red color filters R, blue color filters B, first green color filters G1, second green color filters G2, and white color filters W. The red color filters R are filters for transmitting red light. The blue color filters B are filters for transmitting blue light. The first green color filters G1 are filters (used for the first green) for transmitting first green light. The second green color filters G2 are filters (used for the second green) for transmitting second green light having a hue closer to the blue side than the first green. The white color filters W are filters for transmitting white light. Besides, the white light is light which is obtained by evenly mixing light of all wavelengths (colors) of visible light.

In the first embodiment, first groups C1 and second groups C2 are disposed to line up regularly with each other in the display portion 10, and the first groups C1 includes the red color filters R, the blue color filters B and the first green color filters G1, and the second groups C2 includes the red color filters R, the blue color filters B and the second green color filters G2, in which the second group C2 is equal to the first groups C1 in number of the color filters 11 and is different from the first group C1 in filter combination. Specifically, the first groups C1 including four types of color filters which are the red color filters R, the blue color filters B, the first green color filters G1 and the white color filters W and the second groups C2 including four types of color filters which are the red color filters R, the blue color filters B, the second green color filters G2 and the white color filters W are disposed to line up regularly with each other in the display portion 10. Besides, "the first groups C1 and the second groups C2 line up regularly" means that the first groups C1 and the second groups C2 line up to be repeated with a prescribed ratio in the vertical direction and the horizontal direction in the display portion 10. In FIG. 1, an example is shown in which four groups which are the first group C1, the first group C1, the first group C1 and the second group C2 are lined up repeatedly in the vertical direction and a position of the second group C2 is repeatedly arranged, in the horizontal direction, in a position shifted by three rows in the vertical direction.

In addition, in the first embodiment, in the display portion 10, the number of the second groups C2 is arranged to be smaller than the number of the first groups C1 so that the number of the second green color filters G2 is smaller than the number of the first green color filters G1. Specifically, the number of the first groups C1 and the number of the second groups C2 are disposed with a ratio of 3 to 1 in the display portion 10. That is, the number of the first green color filters G1 and the number of the second green color filters G2 are disposed with a ratio of 3 to 1 in the display portion 10.

Figure 2:
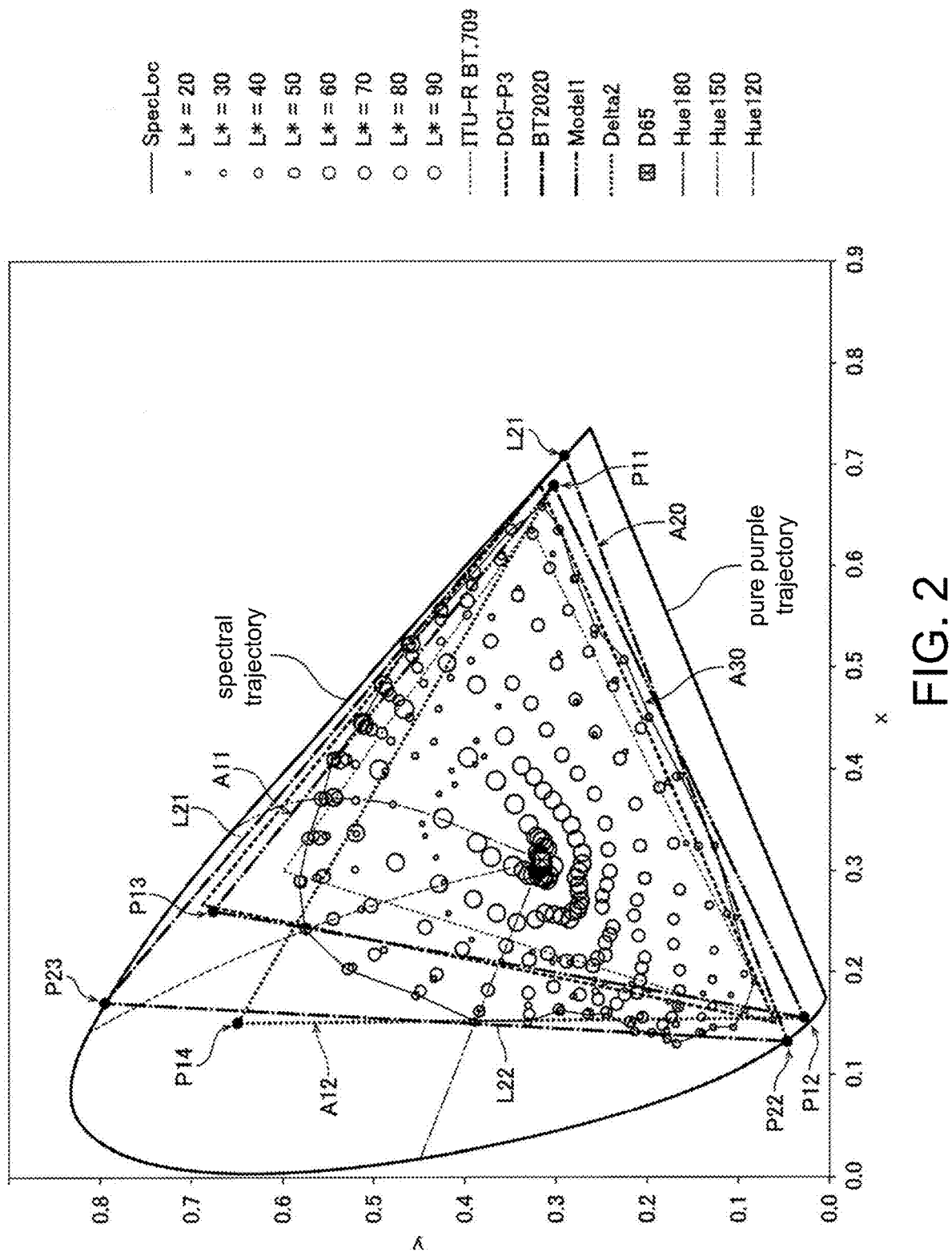
FIG. 2 is a diagram illustrating a relationship between a color gamut range that can be reproduced by the color filters of the display device of the first embodiment and a color gamut range of color gamut standard BT2020.
Figure 3:
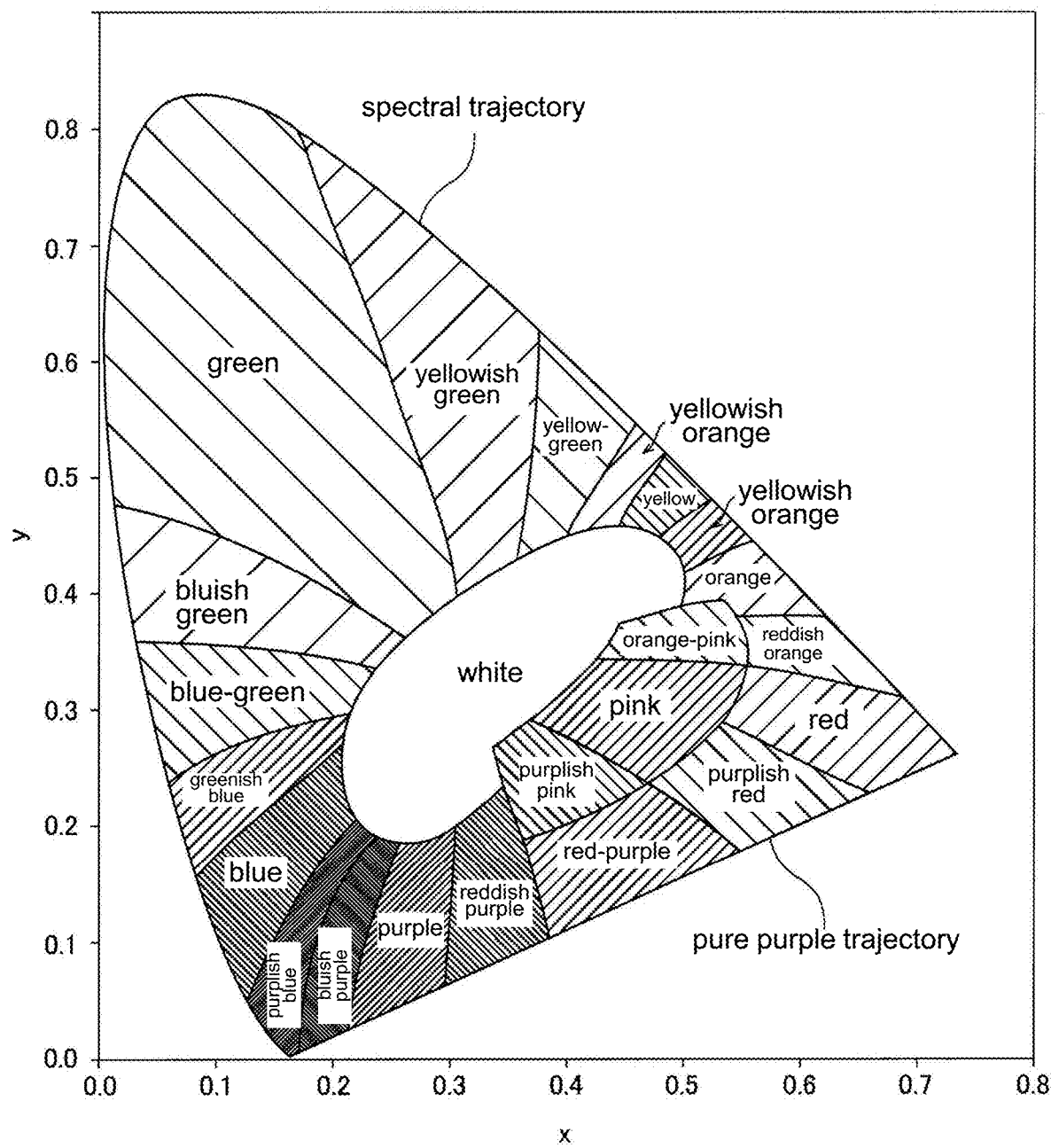
FIG. 3 is a diagram illustrating hues in an xy chromaticity diagram.

Next, the xy chromaticity diagrams of FIGS. 2-5 are used to describe a color gamut that is able to be reproduced in the display device 100. The xy chromaticity diagram is a diagram in which a chromaticity representing a mixed amount of red, blue and green is shown by a two-dimensional coordinate of x and y. As shown in FIG. 2, in the xy chromaticity diagram, all colors are shown in a horseshoe-shaped area which is surrounded by a spectral trajectory and a pure purple trajectory. The spectral trajectory corresponds to a solid color. The pure purple trajectory corresponds to a color that does not exist in the spectrum such as purple, red-purple and the like. The horseshoe-shaped internal area corresponds to a color mixture of multiple colors. Besides, as shown in FIG. 3, in the xy chromaticity diagram, red becomes stronger as the value of x increases, and blue becomes stronger as the value of x decreases. In addition, green becomes stronger as the value of y increases, and blue becomes stronger as the value of y decreases. Besides, in FIG. 2, a color gamut range of the color gamut standard BT.709 (ITU-R suggested), a color gamut range of the color gamut standard DCI-P3 which is wider in color gamut than the color gamut standard BT.709, and a color gamut range A20 of the color gamut standard BT2020 which is wider in color gamut than the color gamut standard DCI-P3 are shown. In addition, in FIG. 2, standard light source D65 corresponding to the average noon light in Europe/Northern Europe is shown. In addition, in FIG. 2, the strength of an absorption rate L* of each hue (wavelength) is shown by the size of ○. In addition, in FIG. 2, a color gamut range A30 of a pointer color showing the color gamut range of an object color is represented as SpecLoc.

As shown in FIG. 2, in the display device 100, the color gamut that can be reproduced by the red color filters R, the blue color filters B and the first green color filters G1 is configured to be a color gamut range A11 of the xy chromaticity diagram. In addition, the color gamut that can be reproduced by the red color filters R, the blue color filters B and the second green color filters G2 is configured to be a color gamut range A12 of the xy chromaticity diagram. In FIG. 2, lines showing the color gamut range A11 and the color gamut range A12 are represented as "Model1" and "Delta2". Besides, the color gamut range A11 is one example of "first color gamut range" in the claims, and the color gamut range A12 is one example of "second color gamut range" in the claims.

The color gamut range A11 is a triangular color gamut range which is formed by a red side vertex P11, a blue side vertex P12 and a green side vertex P13. The color gamut range A12 is a triangular color gamut range which is formed by the red side vertex P11, the blue side vertex P12 and a green side vertex P14. As shown in FIG. 2, in the display device 100, the color gamut range A11 is configured to be wider in color gamut than the color gamut standard BT.709 (ITU-R suggested) and have a color gamut range substantially equivalent to the color gamut range of the color gamut standard DCI-P3. Besides, the vertex P13 is one example of "first green side vertex" in the claims and the vertex P14 is one example of "second green side vertex" in the claims.

In the display device 100, the coordinate of the vertex P13 is (x,y)=(about 0.28, about 0.68). In addition, the coordinate of the vertex P14 is (x,y)=(about 0.15, about 0.65). In terms of an angle on a hue ring (not shown) that shows color hues in a ring shape, the vertex P13 is a position corresponding to a range having a hue difference of 120°-150° with red. In addition, the vertex P14 is a position corresponding to a range having a hue difference of 150°-180° with red. Besides, in FIG. 2, lines showing hue differences of 120°, 150° and 180° with red are respectively represented as Hue 120, Hue 150 and Hue 180.

Figure 4:
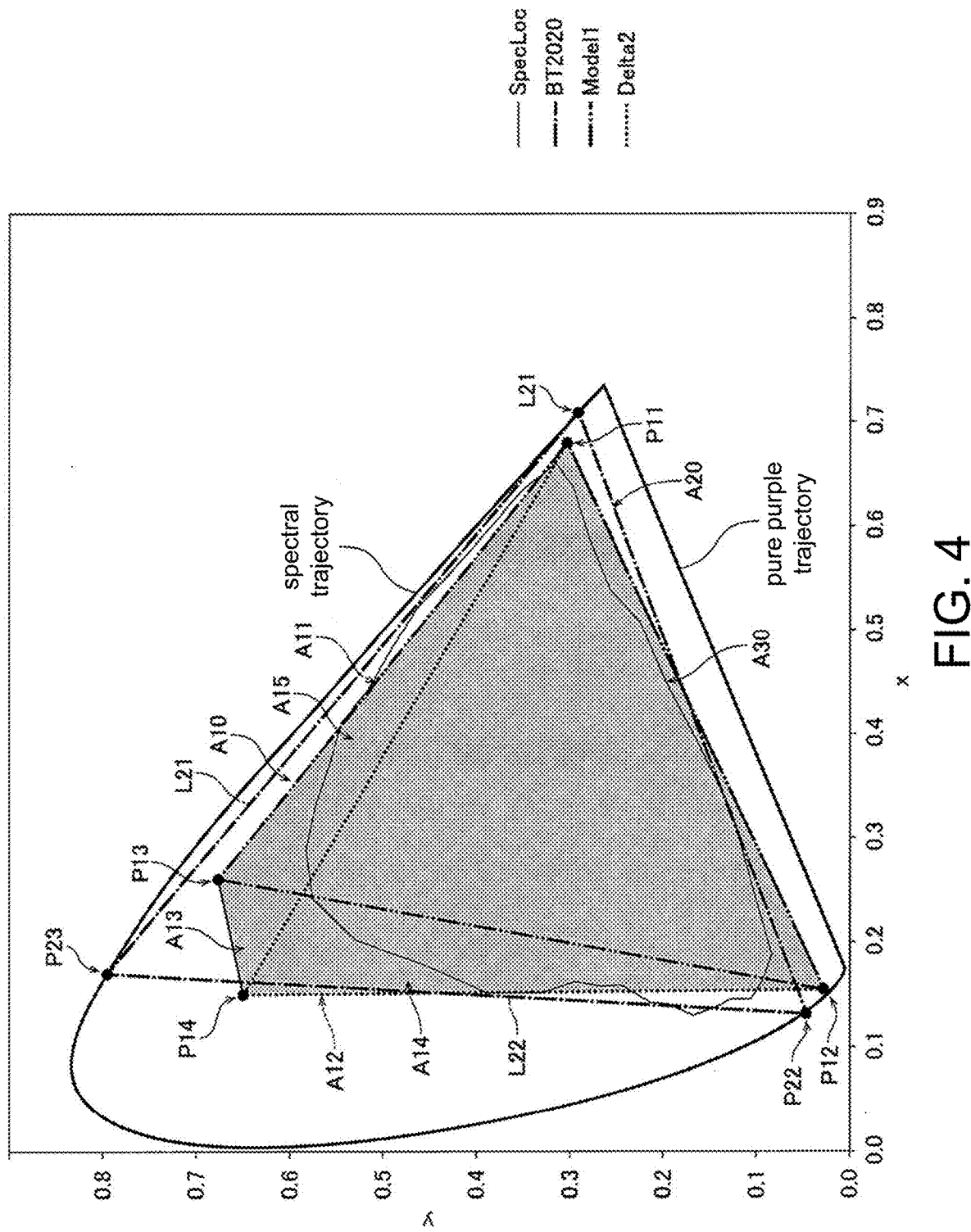
FIG. 4 is a diagram illustrating the color gamut range that can be reproduced by the color filters of the display device of the first embodiment.

As shown in FIG. 1, the first groups C1 do not include the second green color filters G2, and the second groups C2 do not include the first green color filters G1. However, because the first green and the second green have relatively close hues, a desired color can be substantially reproduced when the display portion 10 is viewed as a whole even if none of the groups has both the first green color filters G1 and the second green color filters G2. That is, as shown in FIG. 4, in the display device 100, the color of a square-shaped color gamut range A10 which is formed by the vertex P11, the vertex P12, the vertex P13 and the vertex P14 can be reproduced by four types of color filters which are the red color filters R, the blue color filters B, the first green color filters G1 and the second green color filters G2 included in either the first groups C1 or the second groups C2. The color gamut range A10 is a range including the color gamut range A11, the color gamut range A12, and the color gamut range A13 sandwiched between the color gamut range A11 and the color gamut range A12. Besides, in the display device 100, the square-shaped color gamut range A10 is configured to mostly include a part other than the part on a vertex P23 side of the green side of the color gamut range A20 of the color gamut standard BT2020. In addition, the square-shaped color gamut range A10 is configured to mostly include the color gamut range A30 of the pointer color.

As shown in FIG. 2, in the xy chromaticity diagram, the light absorption rate L* of hues of a region A14 formed by the vertex P12, the vertex P13 and the vertex P14 is relatively smaller than the light absorption rate L* of hues of a region 15 formed by the vertex P11, the vertex P13 and the vertex P14. In other words, in order to make the color appearance uniform, the light brightness of hues of the region A14 is smaller than the light brightness of hues of the region A15. Accordingly, as described above, in the display portion 10, the number of the second green color filters G2 contributing to the light brightness of hues of the region A14 is smaller than the number of the first green color filters G1 contributing to the light brightness of hues of the region A15.

As shown in FIG. 4, in the first embodiment, the first green color filters G1 are configured so that the green side vertex P13 of the color gamut range A11 is disposed near a side L21 which connects the green side vertex P23 and the red side vertex P21 of the color gamut range A20 of the color gamut standard BT2020 in the xy chromaticity diagram. In addition, the second green color filters G2 are configured so that the green side vertex P14 of the color gamut range A12 is disposed near a side L22 which connects the green side vertex P23 and the blue side vertex P22 of the color gamut range A20 of the color gamut standard BT2020 in the xy chromaticity diagram. In addition, the first green color filters G1 is configured so that the vertex P13 is disposed outside of the color gamut range A30 of pointer color in the xy chromaticity diagram, and the second green color filters G2 is configured so that the vertex P14 is disposed outside of the color gamut range A30 of the pointer color in the xy chromaticity diagram.

Specifically, in the xy chromaticity diagram, the vertex P13 is disposed near the side L21 connecting the green side vertex P23 and the red side vertex P21 of the color gamut range A20 of the color gamut standard BT2020, and the values of x and y of the vertex P13 are smaller than those of the side L21. In addition, in the xy chromaticity diagram, the vertex P14 is disposed near the side L22 connecting the green side vertex P23 and the blue side vertex P22 of the color gamut range A20 of the color gamut standard BT2020, and the values of x and y of the vertex P14 are smaller than those of the side L22. In addition, in the xy chromaticity diagram, the vertex P13 and the vertex P14 are respectively disposed so that the value of y is larger than that of the green side boundary of the color gamut range A30 of the pointer color.

In addition, in the first embodiment, the display device 100 is configured to convert the color closer to the vertex P23 side on the green side of the color gamut range A20 of the color gamut standard BT2020 than a line L41 connecting a point P24 and a point P25 to the color on the line L41 connecting the point P24 and the point P25. In the xy chromaticity diagram, the point P24 is a point near the vertex P13 on the side L21 connecting the green side vertex P23 and the red side vertex P21 of the color gamut range A20 of the color gamut standard BT2020. In addition, in the xy chromaticity diagram, the point P25 is a point near the vertex P14 on the side L22 connecting the green side vertex P23 and the blue side vertex P22 of the color gamut range A20 of the color gamut standard BT2020.

Figure 5:
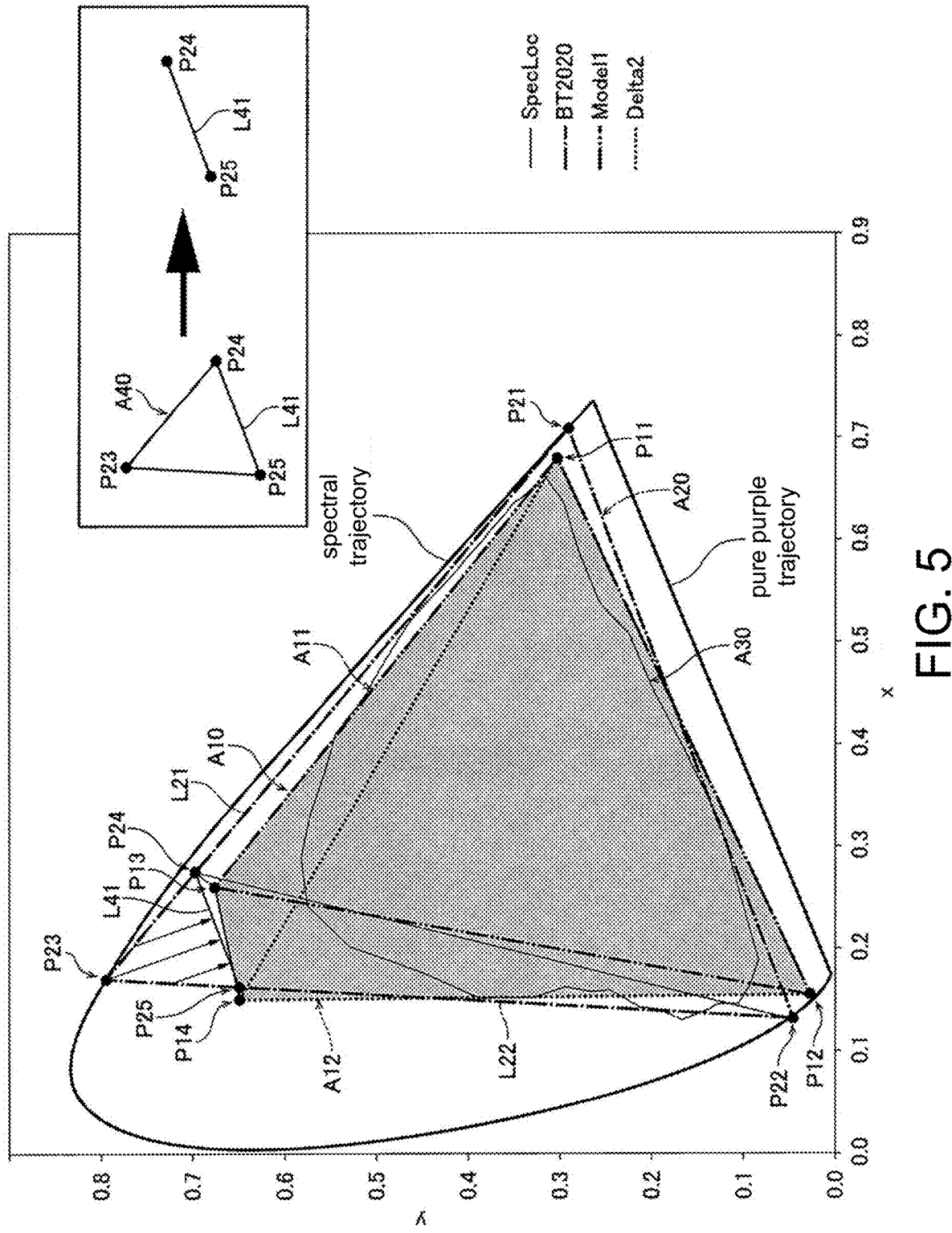
FIG. 5 is a diagram illustrating a method of conversion to a color of a color gamut range that cannot be reproduced by the color filters of the display device of the first embodiment.

Specifically, as shown in FIG. 1, the display device 100 includes a control portion 20. As shown in FIG. 5, the control part 20 (see FIG. 1) calculates the point P24 near the vertex P13, where the point P24 is on the side L21 connecting the green side vertex P23 and the red side vertex P21 of the color gamut range A20 of the color gamut standard BT2020. The point P24 is, for example, an intersection point with the side L21 (the shortest position from the vertex P13 on the side L21) on a perpendicular line of the side L21 passing through the vertex P13. In addition, the control portion 20 calculates the point P25 near the vertex P14, where the point P25 is on the side L22 connecting the green side vertex P23 and the blue side vertex P22 of the color gamut range A20 of the color gamut standard BT2020. The point P25 is, for example, an intersection point with the side L22 (the shortest position from the vertex P14 on the side L22) on a perpendicular line of the side L22 passing through the vertex P14.

Then, the control unit 20 performs conversion so that data (image signals) indicating the color of a triangular color gamut range A40 which is formed by the vertex P23, the point P24 and the point P25 is projected to data (image signals) indicating the color on the line L41 connecting the point P24 and the point P25. That is, the control unit 20 converts data indicating the color on a straight line shown by an arrow in the drawing to data indicating the color at the front end portion of the straight line (on the line L41). Besides, the control part 20 is an example of "first conversion part" of the claims.

Effects of First Embodiment

In the first embodiment, the following effects can be obtained.

In the first embodiment, as described above, the first groups C1 including the first green color filters G1 and the second groups C2 including the second green color filters G2, which are disposed to line up regularly with each other in the display portion 10, are equal in number of the color filters 11 and different in filter combination. Accordingly, the first groups C1 definitely include the first green color filters G1 and the second groups C2 definitely include the second green color filters G2, and the filter combinations are different in the first groups C1 and the second groups C2. Accordingly, even when the number of the color filters 11 included in one group is set to four, the color filters 11 of five colors which are red, blue, first green, second green and another color (white) can also be disposed by the first groups C1 and the second groups C2. As a result, even when the first green color filters G1 and the second green color filters G2 are disposed in the display portion 10, the number of the color filters 11 included in one group can also be relatively reduced, and thus the decrease in brightness of the displayed image caused by the reduction in the area of each color filter 11 can be suppressed and a reproducible color gamut range A10 can be expanded.

In addition, in the first embodiment, as described above, the color filters 11 include the white color filters W. Besides, the first groups C1 and the second groups C2 are disposed to line up regularly with each other in the display portion 10, in which the first groups C1 includes four types of color filters which are the red color filters R, the blue color filters B, the first green color filters G1 and the white color filters W, the second groups C2 includes four types of color filters which are the red color filters R, the blue color filters B, the second green color filters G2 and the white color filters W. Accordingly, the color filters can be combined reliably in a manner that the first groups C1 definitely includes the first green color filters G1, the second groups C2 definitely include the second green color filters G2, and the filter combinations are different in the first groups C1 and the second groups C2. In addition, the color filters 11 include the white color filters W which transmit light of most wavelengths (colors) in a visible light band, and thus the brightness of the displayed image can be improved compared with a case in which the white color filters W are not included.

In addition, in the first embodiment, as described above, in the display portion 10, the number of the second groups C2 is arranged smaller than the number of the first groups C1 so that the number of the second green color filters G2 is smaller than the number of the first green color filters G1. Accordingly, the brightness of the second green having a hue closer to the blue side than the first green can be more easily reduced than the brightness of the first green, and thus variations of the color appearance in each hue can be suppressed when the first green color filters G1 and the second green color filters G2 are disposed in the display portion 10.

In addition, in the first embodiment, as described above, the first green color filters G1 are configured in a manner that the green side vertex P13 of the triangular color gamut range A11 showing the color gamut that can be displayed by the red color filters R, the blue color filters B and the first green color filters G1 is disposed near the side L21 connecting the green side vertex P23 and the red side vertex P21 of the color gamut range A20 of the color gamut standard BT2020 in the xy chromaticity diagram in which a chromaticity representing a mixed amount of red, blue and green is shown by a two-dimensional coordinate. In addition, the second green color filters G2 are configured in a manner that the green side vertex P14 of the triangular color gamut range A12 showing the color gamut that can be displayed by the red color filters R, the blue color filters B and the second green color filters G2 is disposed near the side L22 connecting the green side vertex P23 and the blue side vertex P22 of the color gamut range A20 of the color gamut standard BT2020 in the xy chromaticity diagram. Accordingly, compared with a case in which the vertex P13 is not near the side L21 connecting the green side vertex P23 and the red side vertex P21 of the color gamut range A20 of the color gamut standard BT2020 and the vertex P14 is not near the side L22 connecting the green side vertex P23 and the blue side vertex P22 of the color gamut range A20 of the color gamut standard BT2020, the color gamut range A10 that can be reproduced by four types of color filters 11 can be easily brought close to the color gamut range A20 of the color gamut standard BT2020.

In addition, in the first embodiment, as described above, the first green color filters G1 is configured so that the vertex P13 is disposed outside of the color gamut range A30 of the pointer color showing a color gamut range of the object color in the xy chromaticity diagram, and the second green color filters G2 is configured so that the vertex P14 is disposed outside of the color gamut range A30 of the pointer color showing a color gamut range of the object color in the xy chromaticity diagram. Accordingly, compared with a case in which any one or both of the vertex P13 and the vertex P14 are disposed inside of the color gamut range A30 of the pointer color, the color gamut range A10 that can be reproduced by four types of color filters 11 can be more easily expanded than the color gamut range A30 of the pointer color.

In addition, in the first embodiment, as described above, the display device 100 includes the control part 20 which converts the color closer to the vertex P23 side on the green side of the color gamut range A20 of the color gamut standard BT2020 than the line L41 connecting the point P24 and the point P25 to the color on the line L41 connecting the point P24 and the point P25. In the xy chromaticity diagram, the point P24 is a point near the vertex P13 on the side L21 connecting the green side vertex P23 and the red side vertex P21 of the color gamut range A20 of the color gamut standard BT2020. In addition, in the xy chromaticity diagram, the point P25 is a point near the vertex P14 on the side L22 connecting the green side vertex P23 and the blue side vertex P22 of the color gamut range A20 of the color gamut standard BT2020. Accordingly, in the color gamut range A20 of the color gamut standard BT2020, the color of the triangular color gamut range A40 which is formed by the point P24, the point P25 and the green side vertex P23 can be converted to the color on the line L41 connecting the point P24 and the point P25 by the control portion 20, and thus for the color gamut range A20 of the color gamut standard BT2020, the color gamut range of the green side of a color gamut that cannot be reproduced by the four types of color filters 11 can be easily converted to the color that is relatively close in saturation.

Second Embodiment

The second embodiment is described with reference to FIG. 1 and FIG. 6. Different from the display device 100 of the first embodiment that converts the color of the triangular color gamut range A40 to the color on the line L41, in the second embodiment, an example is described in which the color of a triangular color gamut range A51 is converted to the color of a triangular color gamut range A52. Besides, in the drawings, the same components as those in the first embodiment are denoted by the same symbols.

As shown in FIG. 1, a display device 200 according to the second embodiment of the disclosure includes a control part 220. Besides, the control part 220 is an example of "second conversion part" in the claims.

Figure 6:
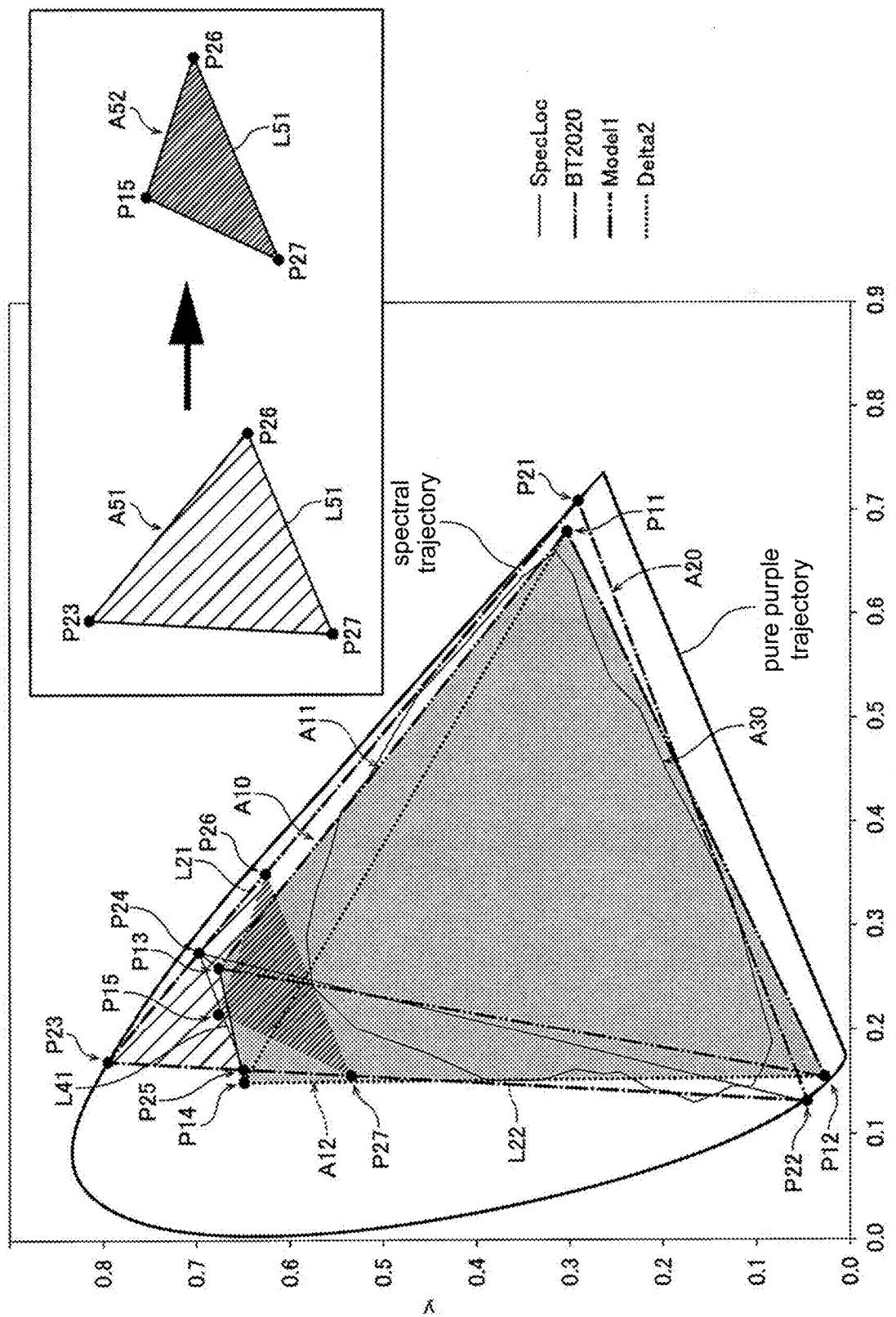
FIG. 6 is a diagram illustrating a method of conversion to a color of a color gamut range that cannot be reproduced by the color filters of a display device of a second embodiment.

As shown in FIG. 6, in the second embodiment, the control portion 220 is configured to convert the color of the color gamut range A51 to the color of the color gamut range A52. In the xy chromaticity diagram, the color gamut range A51 is a triangular color gamut range formed by a bottom side L51 and the green side vertex P23 of the color gamut range A20 of the color gamut standard BT2020, in which the bottom side L51 connects a point on the side L22 that connects the green side vertex P23 and the blue side vertex P22 of the color gamut range A20 of the color gamut standard BT2020 and a point on the side L21 that connects the green side vertex P23 and the red side vertex P21 of the color gamut range A20 of the color gamut standard BT2020, and the bottom side L51 is disposed outside of the color gamut range A30 of the pointer color. In addition, in the xy chromaticity diagram, the color gamut range A52 is a triangular color gamut range formed by the bottom side L51 and a vertex P15 on the line L41, in which the line L41 connects the point P24 near the vertex P13 on the side L21 that connects the green side vertex P23 and the red side vertex P21 of the color gamut range A20 of the color gamut standard BT2020 and the point P25 near the vertex P14 on the side L22 that connects the green side vertex P23 and the blue side vertex P22 of the color gamut range A20 of the color gamut standard BT2020. Besides, the color gamut range A51 is an example of "third color gamut range" in the claims, and the color gamut range A52 is an example of "fourth color gamut range" in the claims.

Specifically, the control part 220 calculates a point P26 and a point P27 in a manner that the bottom side L51 connecting the point P26 and the point P27 is disposed outside of the color gamut range A30 of the pointer color, in which the point P26 is on the side L21 connecting the green side vertex P23 and the red side vertex P21 of the color gamut range A20 of the color gamut standard BT2020, and the point P27 is on the side L22 connecting the green side vertex P23 and the blue side vertex P22 of the color gamut range A20 of the color gamut standard BT2020. Besides, "the bottom side L51 is disposed outside of the color gamut range A30 of the pointer color" means that the bottom side L51 is not in contact with the contour of the color gamut range A30 of the pointer color. In addition, the control portion 220 calculates the vertex P15 on the line L41 connecting the point P24 and the point P25. The vertex P15 is a point substantially at the center between the point P24 and the point P25.

Then, the control portion 220 converts data (image signals) indicating the color of the triangular color gamut range A51 formed by the vertex P23, the point P26 and the point P27 to data (image signals) indicating the color of the triangular color gamut range A52 formed by the vertex P15, the point P26 and the point P27. That is, the control portion 20 converts the data indicating the color in the color gamut range A51 to the data indicating the color in the color gamut range A52 so as to compress the size of the triangular color gamut range A51 into the size of the triangular color gamut range A52.

Besides, other configurations of the display device 200 of the second embodiment are the same as the first embodiment.

Effects of Second Embodiment

In the second embodiment, as described above, the display device 200 includes the control part 220 which converts the color of the color gamut range A51 to the color of the color gamut range A52. In the xy chromaticity diagram, the color gamut range A51 is a triangular color gamut range formed by the bottom side L51 and the green side vertex P23 of the color gamut range A20 of the color gamut standard BT2020, the bottom side L51 connecting the point on the side L22 that connects the green side vertex P23 and the blue side vertex P22 of the color gamut range A20 of the color gamut standard BT2020 and the point on the side L21 that connects the green side vertex P23 and the red side vertex P21 of the color gamut range A20 of the color gamut standard BT2020, and the bottom side L51 being disposed outside of the color gamut range A20 of the pointer color. In addition, in the xy chromaticity diagram, the color gamut range A52 is the triangular color gamut range formed by the bottom side L51 and the vertex P15 on the line L41, in which the line L41 connects the point P24 near the vertex P13 on the side L21 that connects the green side vertex P23 and the red side vertex P21 of the color gamut range A20 of the color gamut standard BT2020 and the point P25 near the vertex P14 on the side L22 that connects the green side vertex P23 and the blue side vertex P22 of the color gamut range A20 of the color gamut standard BT2020. Accordingly, in the color gamut range A20 of the color gamut standard BT2020, the color of the triangular color gamut range A51 formed by the green side vertex P23 and the bottom side L51 can be converted to the color of the triangular color gamut range A52 formed by the bottom side L51 and the vertex P15 on the line L41 connecting the point P24 and the point P25, and thus for the color gamut range A20 of the color gamut standard BT2020, the green side range of the color gamut that cannot be reproduced by the four types of color filters 11 can be easily converted to the color that is relatively close in saturation. In addition, compared with a case in which the color of the triangular color gamut range is converted to the color on the line, color gradation can be expressed without being saturated with a specific color (losing color gradation). In addition, because the bottom side L51 is disposed outside of the color gamut range A30 of the pointer color, and thus the color of the color gamut range A30 of the pointer color pointer color can be faithfully reproduced at least in the green side color gamut.

Besides, other effects of the second embodiment are the same as the first embodiment.

Variation Examples

Besides, the embodiments disclosed herein should be considered as being illustrative rather than limitative in all respects. The scope of the disclosure is shown by the claims instead of by the description of the above embodiments, and further includes meanings equivalent to the scope of the claims and all modifications (variation examples) in the scope.

Figure 7:
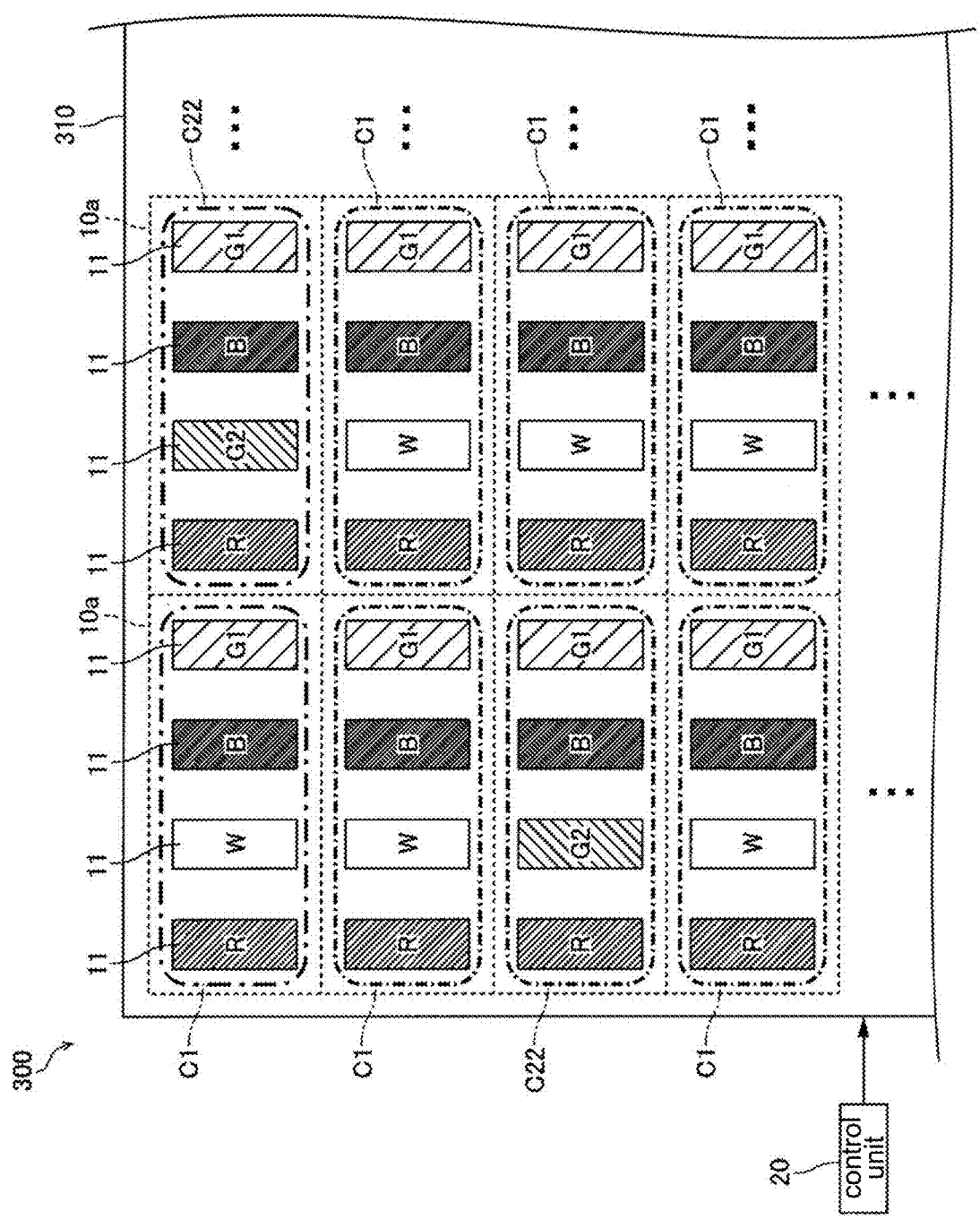
FIG. 7 is a diagram illustrating an arrangement of the color filters of a display device of a first variation example of the first embodiment and the second embodiment.

For example, in the first and second embodiments, an example is shown in which the first groups C1 and the white color filters W and the second groups C2 are disposed to line up regularly with each other in the display portion 10, in which the first groups C1 include the red color filters R, the blue color filters B, the first green color filters G1 and the white color filters W, and the second groups C2 includes the red color filters R, the blue color filters B, the second green color filters G2 and the white color filters W; however, the disclosure is not limited hereto. In the disclosure, as shown in a display device 300 of the first variation example shown in FIG. 7, the first groups C1 include the red color filters R, the blue color filters B, the first green color filters G1 and the white color filters W and second groups C22 include the red color filters R, the blue color filters B, the first green color filters G1 and the second green color filters G2 may also be disposed to line up regularly with each other in a display portion 310. In FIG. 7, an example is shown in which three groups which are the first group C1, the first group C1 and the second group C22 are lined up repeatedly in the vertical direction, and the position of the second group C22 is repeatedly arranged, in the horizontal direction, in a position shifted by two columns in the vertical direction.

Figure 8:
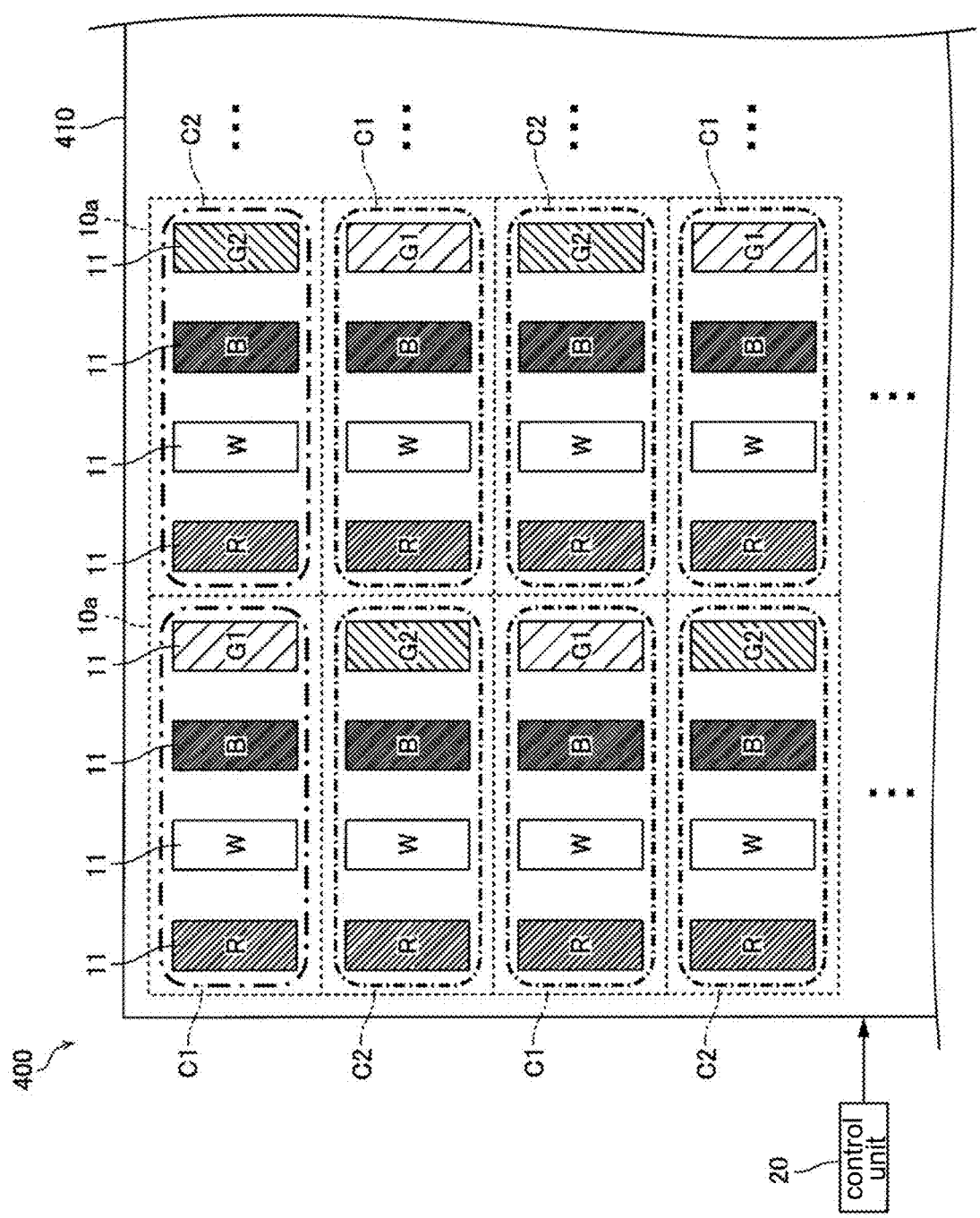
FIG. 8 is a diagram illustrating an arrangement of the color filters of a display device of a second variation example of the first embodiment and the second embodiment.

In addition, in the first and second embodiments, an example is shown in which in the display portion 10, the number of the second groups C2 is disposed to be smaller than the number of the first groups C1 so that the number of the second green color filters G2 is smaller than the number of the first green color filters G1; however, the disclosure is not limited hereto. In the disclosure, as shown in a display device 400 of a second variation example shown in FIG. 8, in a display portion 410, the number of the second groups C2 is equal to the number of the first groups C1 so that the number of the second green color filters G2 is equal to the number of the first green color filters G1.

In addition, in the first and second embodiments, an example is shown in which four color filters 11 are disposed in each pixel 10a in the display portion 10, but the disclosure is not limited hereto. In the disclosure, as shown in a display device 500 of the third variation example shown in FIG. 9, a display device 600 of the fourth variation example shown in FIG. 10, and a display device 700 of the fifth variation example shown in FIG. 11, three color filters 11 may be disposed in each pixel 510a in a display portion 510 (610, 710).

Figure 9:
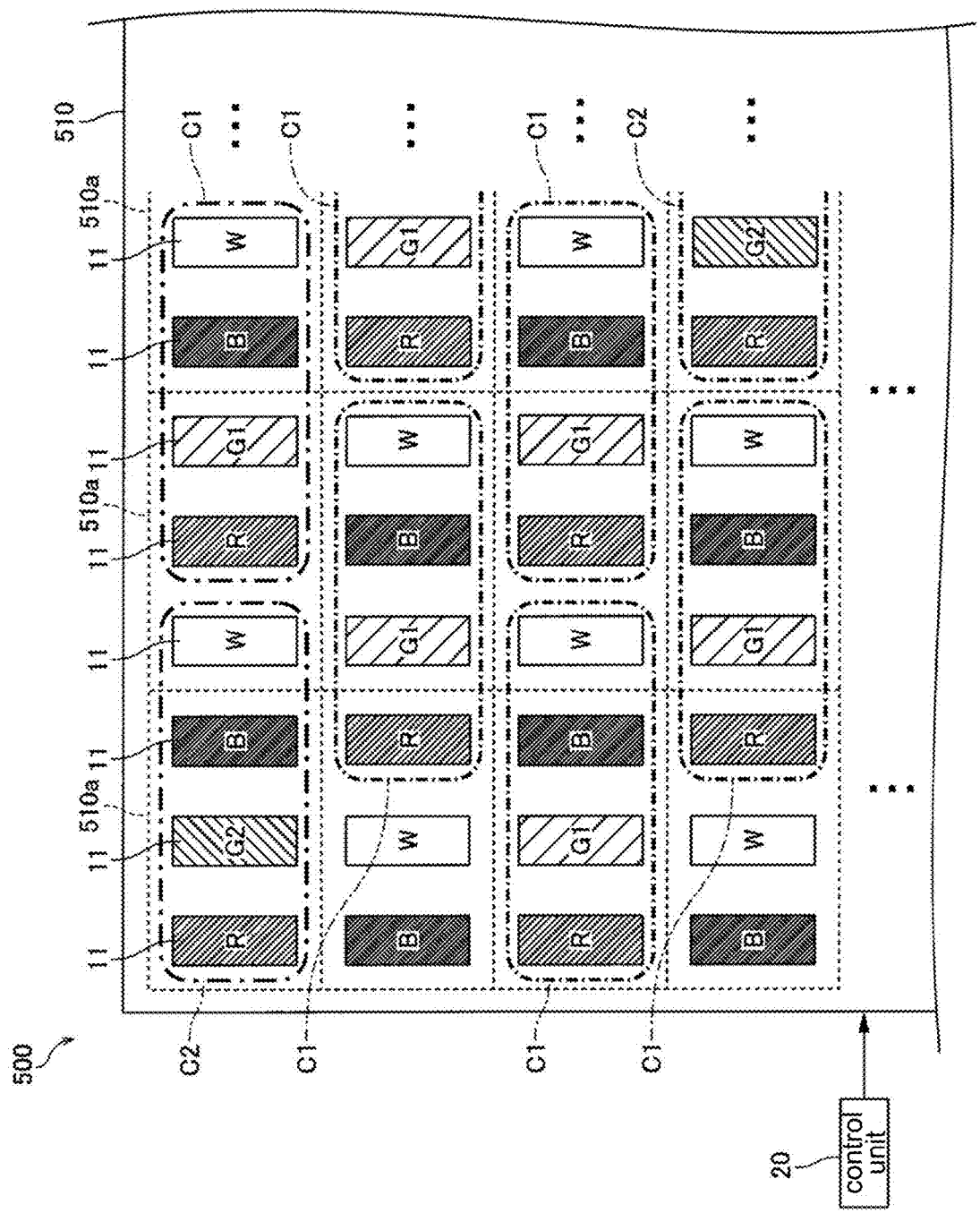
FIG. 9 is a diagram illustrating an arrangement of the color filters of a display device of a third variation example of the first embodiment and the second embodiment.
Figure 10:
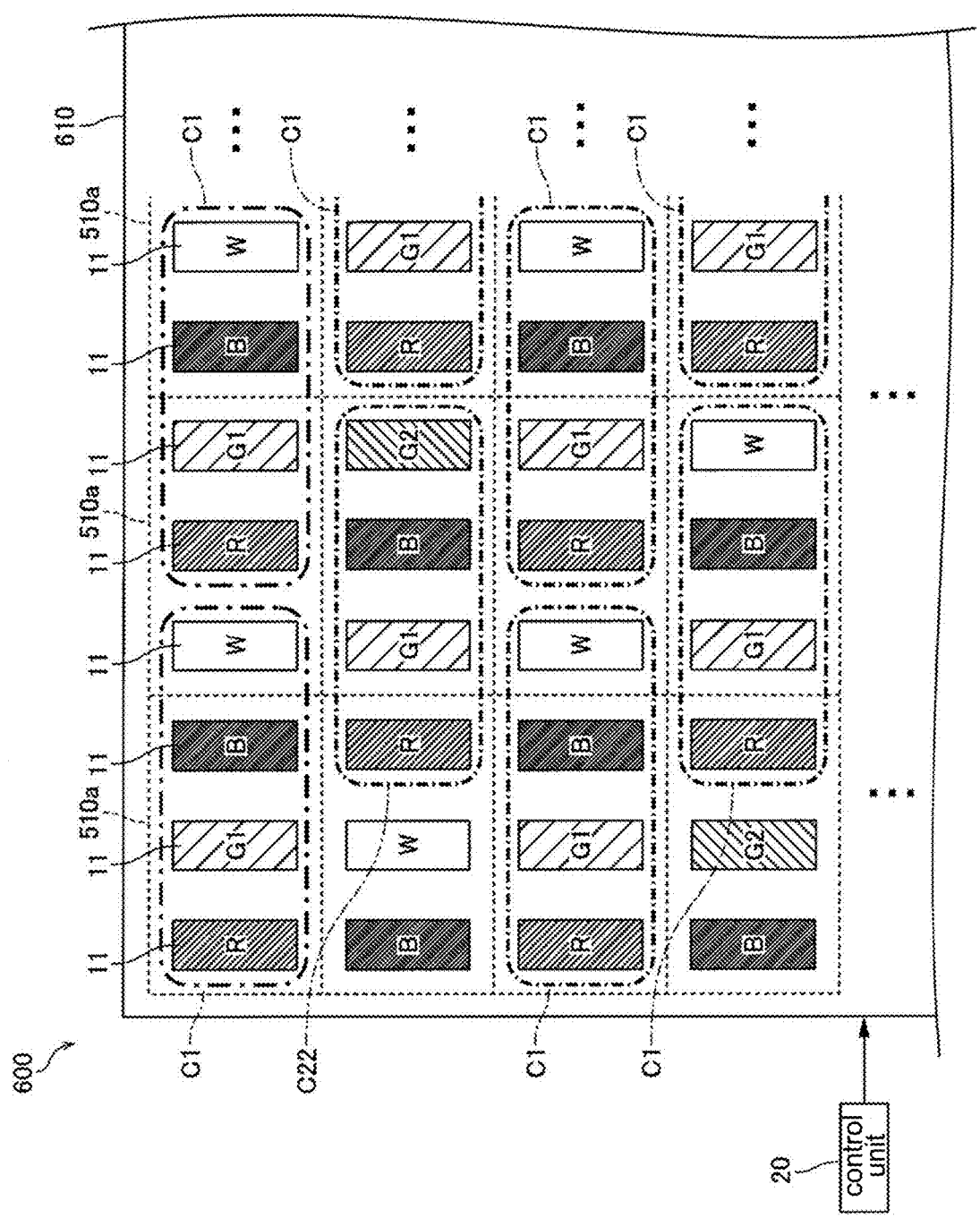
FIG. 10 is a diagram illustrating an arrangement of the color filters of the display device of a fourth variation example of the first embodiment and the second embodiment.
Figure 11:
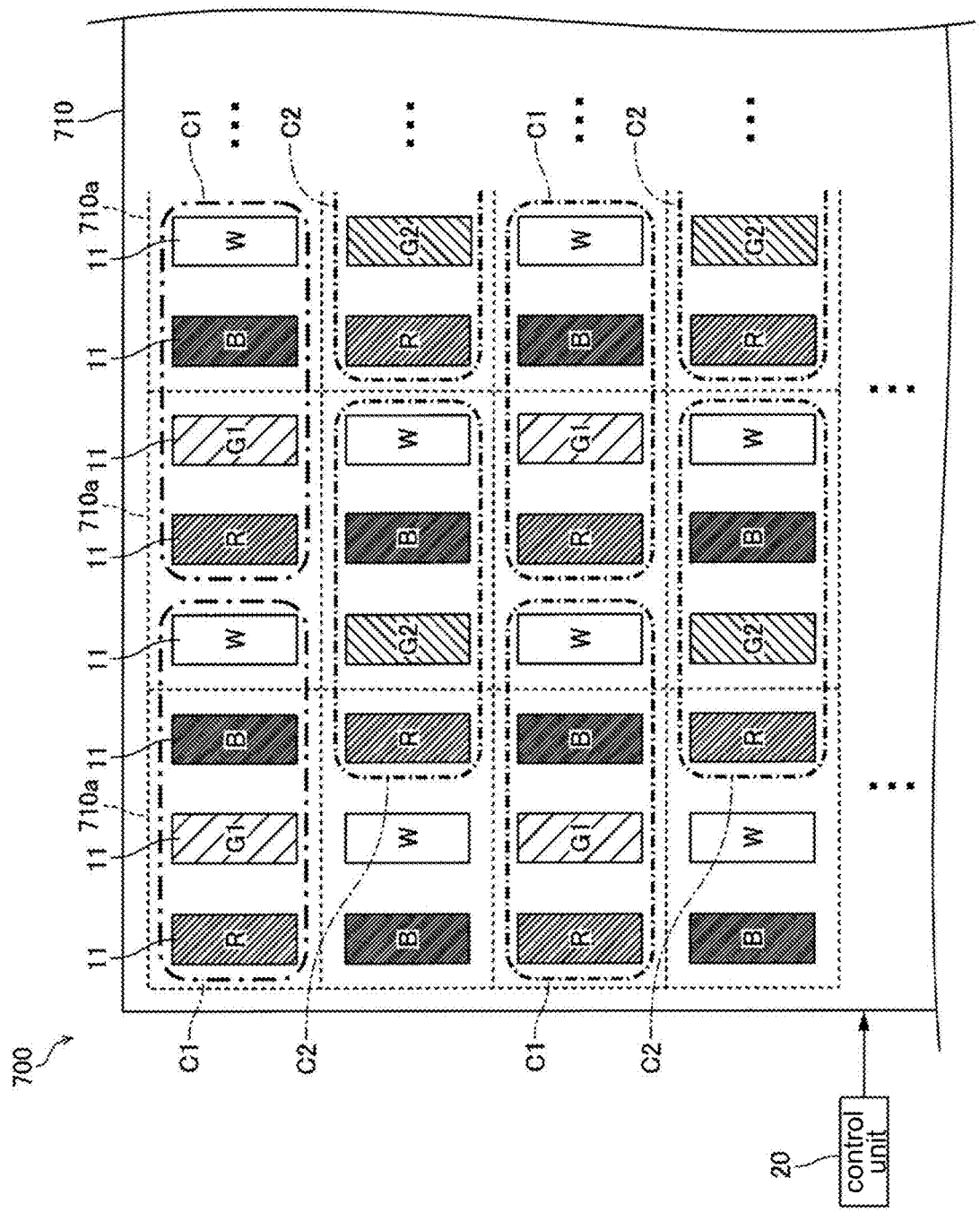
FIG. 11 is a diagram illustrating an arrangement of the color filters of the display device of a fifth variation example of the first embodiment and the second embodiment.

In FIG. 9, FIG. 10 and FIG. 11, different from the first and second embodiments, it is disposed in the vertical direction in a manner that the groups (the first groups C1 or the second groups C2) are shifted by half (two parts of the color filter 11) in the horizontal direction. In FIG. 9 and FIG. 11, an example is shown in which the number of the first groups C1 and the number of the second groups C2 are disposed with a ratio of 3 to 1. In FIG. 10, an example is shown in which the number of the first groups C1 and the number of the second groups C22 are disposed with a ratio of 3 to 1.

In addition, in the first and second embodiments, an example is shown in which the color filters 11 are configured to include the white color filters W, but the disclosure is not limited hereto. In the disclosure, the color filters 11 may also be configured not to include the white color filters W.

In addition, in the first and second embodiments, an example is shown in which the display device 100 is configured as a liquid crystal display (LCD), but the disclosure is not limited hereto. In the disclosure, the display device may also be configured as a white OLED+color filter type display device (WOLED) in which a white organic LED (OLED) is combined with color filters.

Figure 12:
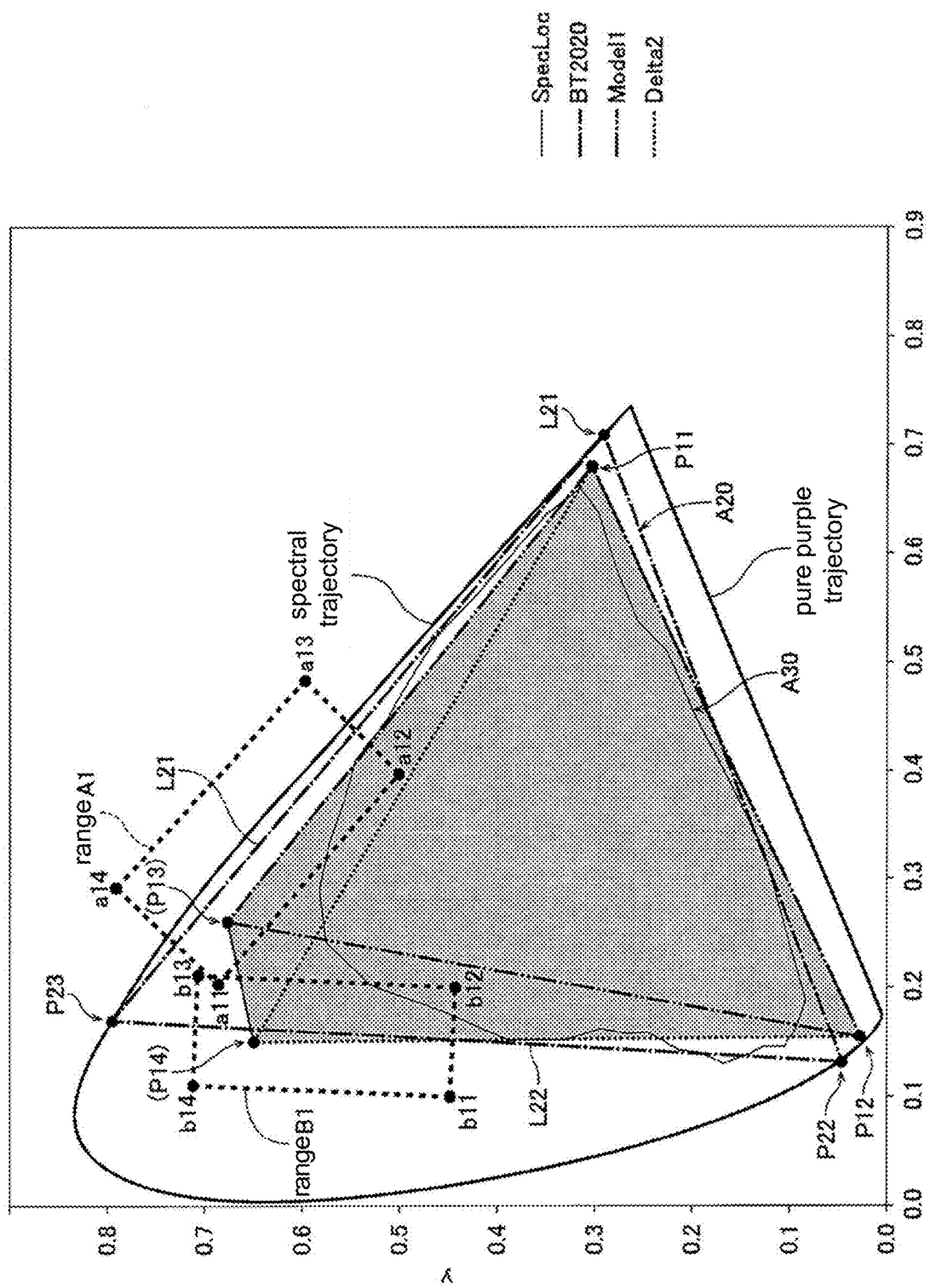
FIG. 12 is a diagram illustrating a color gamut range that can be reproduced by the color filters of the display device of the variation examples of the disclosure.
Figure 13:
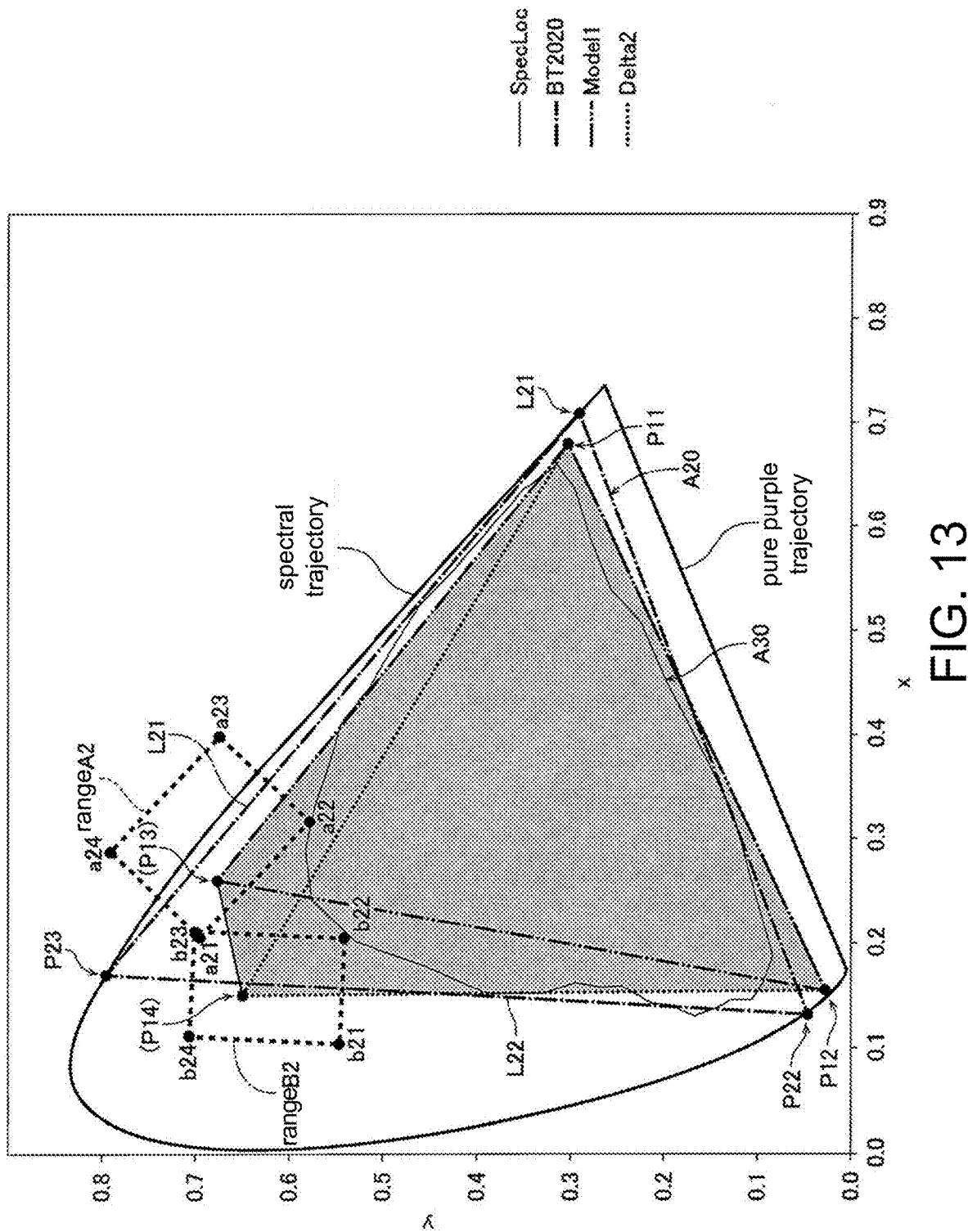
FIG. 13 a diagram illustrating another color gamut range that can be reproduced by the color filters of the display device of the variation examples of the disclosure.

In addition, in the first and second embodiments, an example is shown in which the coordinate of the green side vertex P13 of the color gamut range A11 is set to (x,y)= (about 0.28, about 0.68), and the coordinate of the green side vertex P14 of the color gamut range A12 is set to (x,y)= (about 0.15, about 0.65), but the disclosure is not limited hereto. In the disclosure, as shown in FIG. 12, the vertex P13 may be any position in a range A1 and the vertex P14 may be any position in a range B1. In addition, as shown in FIG. 13, the vertex P13 may be any position in a range A2 (smaller than the range A1) and the vertex P14 may be any position in a range B2 (smaller than the range B1). Besides, the range A1 and the range B1 include a part located inside of the color gamut range A30 of the pointer color, and the range A2 and the range B2 do not include the part located inside of the color gamut range A30 of the pointer color.

As shown in FIG. 12, the range A1 is a square-shaped range surrounded by four points, namely a point a11, a point a12, a point a13 and a point a14. The coordinate of the point a11, the coordinate of the point a12, the coordinate of the point a13 and the coordinate of the point a14 are respectively (x, y)=(0.200, 0.689), (0.400, 0.501), (0.490, 0.597) and (0.290, 0.785). Besides, a straight line (y=−0.9387x+0.8766) connecting the point a11 and the point a12 and a straight line (y=−0.9387x+1.0566) connecting the point a13 and the point a14 are straight lines substantially parallel to the side L21 connecting the green side vertex P23 and the red side vertex P21 of the color gamut range A20 of the color gamut standard BT2020. In addition, a straight line (y=1.065x+ 0.476) connecting the point a11 and the point a14 and a straight line (y=1.065x+0.075) connecting the point a12 and the point a13 are straight lines substantially perpendicular to the straight line connecting the point a11 and the point a12 and the straight line connecting the point a13 and the point a14.

In addition, the range B1 is a square-shaped range surrounded by four points, namely a point b11, a point b12, a point b13 and a point b14. The coordinate of the point b11, the coordinate of the point b12, the coordinate of the point b13 and the coordinate of the point b14 are respectively (x,y)=(0.100, 0.449), (0.204, 0.444), (0.217, 0.702) and (0.113, 0.707). Besides, a straight line (y=19.256x−3.477) connecting the point b11 and the point b14 and a straight line (y=19.256x−1.477) connecting the point b12 and the point b13 are straight lines substantially parallel to the side L22 connecting the green side vertex P23 and the blue side vertex P22 of the color gamut range A20 of the color gamut standard BT2020. In addition, a straight line (y=−0.052x+ 0.454) connecting the point b11 and the point b12 and a straight line (y=−0.052x+0.713) connecting the point b13 and the point b14 are straight lines substantially perpendicular to the straight line connecting the point b11 and the point b14 and the straight line connecting the point b12 and the point b13.

In addition, as shown in FIG. 13, the range A2 is a square-shaped range surrounded by four points, namely a point a21, a point a22, a point a23 and a point a24. The coordinate of the point a21, the coordinate of the point a22, the coordinate of the point a23 and the coordinate of the point a24 are respectively (x,y)=(0.200, 0.689), (0.320, 0.576), (0.410, 0.672) and (0.290, 0.785). Besides, a straight line (y=−0.9387x+0.8766) connecting the point a21 and the point a22 and a straight line (y=−0.9387x+1.0566) connecting the point a23 and the point a24 are straight lines substantially parallel to the side L21 connecting the green side vertex P23 and the red side vertex P21 of the color gamut range A20 of the color gamut standard BT2020. In addition, a straight line (y=1.065x+0.476) connecting the point a21 and the point a24 and a straight line (y=1.065x+ 0.235) connecting the point a22 and the point a23 are straight lines substantially perpendicular to the straight line connecting the point a21 and the point a22 and the straight line connecting the point a23 and the point a24.

In addition, the range B2 is a square-shaped range surrounded by four points, namely a point b21, a point b22, a point b23 and a point b24. The coordinate of the point b21, the coordinate of the point b22, the coordinate of the point b23 and the coordinate of the point b24 are respectively (x,y)=(0.105, 0.545), (0.209, 0.540), (0.217, 0.702) and (0.113, 0.707). Besides, a straight line (y=19.256x−3.477) connecting the point b21 and the point b24 and a straight line (y=19.256x−1.477) connecting the point b22 and the point b23 are straight lines substantially parallel to the side L22 connecting the green side vertex P23 and the blue side vertex P22 of the color gamut range A20 of the color gamut standard BT2020. In addition, a straight line (y=−0.052x+0.551) connecting the point b21 and the point b22 and a straight line (y=−0.052x+0.713) connecting the point b23 and the point b24 are straight lines substantially perpendicular to the straight line connecting the point b21 and the point b24 and the straight line connecting the point b22 and the point b23.

According to one embodiment of the disclosure, a display device is provided to include: color filters including red color filters, blue color filters, first green color filters used for a first green, and second green color filters used for a second green having a hue closer to a blue side than the first green; and a display portion in which the color filters are disposed. First groups and second groups are disposed to line up regularly with each other in the display portion. The first groups include the red color filters, the blue color filters and the first green color filters, the second groups include the red color filters, the blue color filters and the second green color filters, and the second group is equal to the first group in number of the color filters and is different from the first groups in filter combination.

In the display device of the disclosure, as described above, the first groups including the first green color filters and the second groups including the second green color filters, which are disposed to line up regularly with each other, are equal in number of the color filters and are different in filter combination. Accordingly, the first groups definitely include the first green color filters and the second groups definitely include the second green color filters, and the filter combinations are different in the first groups and the second groups. Accordingly, for example, even when the number of the color filters included in one group is set to four, the color filters of five colors which are red, blue, first green, second green and the like can also be disposed by the first groups and the second groups. As a result, even when the first green color filters and the second green color filters are disposed in the display portion, the number of the color filters included in one group can also be relatively reduced, and thus the decrease in brightness of the displayed image caused by the reduction in the area of each color filter can be suppressed and the reproducible color gamut range can be expanded. Moreover, because the first green and the second green have relatively close hues, it is considered that a desired color can be substantially reproduced when the display portion is viewed as a whole even if none of the groups has both the first green color filters and the second green color filters.

Other Configurations

In one embodiment of the disclosure, the color filters may further include white color filters; and the first groups and the second groups are disposed to line up regularly with each other in the display portion. The first groups include four types of color filters which are the red color filters, the blue color filters, the first green color filters and the white color filters, the second groups include four types of color filters which are the red color filters, the blue color filters, the second green color filters and the white color filters or which are the red color filters, the blue color filters, the first green color filters and the second green color filters. According to this configuration, in any one of a case in which the second groups including four types of color filters which are the red color filters, the blue color filters, the second green color filters and the white color filters and a case in which the second groups including four types of color filters which are the red color filters, the blue color filters, the first green color filters and the second green color filters, the color filters can be combined reliably so that the first groups definitely include the first green color filters and the second groups definitely include the second green color filters and the filter combination is different in the first groups and the second groups. In addition, because the color filters include the white color filters which transmit light of most wavelengths (colors) in a visible light band, brightness of the displayed image can be improved compared with a case in which the white color filters are not included.

In one embodiment of disclosure, preferably, in the display portion, the number of the second groups is arranged to be equal to the number of the first groups or smaller than the number of the first groups so that the number of the second green color filters is at least equal to the number of the first green color filters or smaller than the number of the first green color filters. Here, light with a hue closer to the blue side (for example, cyan) than the green hue has a low reflectivity with respect to light with a hue closer to the red side (for example, yellow) than the green hue, and thus the second green may have a relatively lower brightness with respect to the first green so as to make the color appearance uniform in each hue. Therefore, according to the above configuration, the brightness of the second green having a hue closer to the blue side than the first green can be more easily reduced than the brightness of the first green, and thus variations of the color appearance in each hue can be suppressed when the first green color filters and the second green color filters are disposed in the display portion.

In one embodiment of the disclosure, in an xy chromaticity diagram in which a chromaticity representing a mixed amount of red, blue and green is shown by a two-dimensional coordinate, the first green color filters may be configured in a manner that a first green side vertex, which is on the green side of a triangular first color gamut range showing a color gamut that is able to be displayed by the red color filters, the blue color filters and the first green color filters, is disposed near a side connecting a green side vertex and a red side vertex of a color gamut range of a color gamut standard BT2020 The second green color filters may be configured in a manner that a second green side vertex, which is on the green side of a triangular second color gamut range showing a color gamut that is able to be displayed by the red color filters, the blue color filters and the second green color filters, is disposed near a side that connects the green side vertex and a blue side vertex of the color gamut range of color gamut standard BT2020 in the xy chromaticity diagram. Here, a color gamut range that can be reproduced by four types of color filters which are the red color filters, the blue color filters, the first green color filters and the second green color filters is a square shaped range which is formed by the red side vertex of the first color gamut range (the second color gamut range), the blue side vertex of the first color gamut range (the second color gamut range), the first green side vertex, and the second green side vertex. Therefore, according to the above configuration, compared with a case in which the first green side vertex is not near the side connecting the green side vertex and the red side vertex of the color gamut range of color gamut standard BT2020 and the second green side vertex is not near the side connecting the green side vertex and the blue side vertex of the color gamut range of color gamut standard BT2020, the color gamut range that can be reproduced by four types of color filters can be easily brought close to the color gamut range of color gamut standard BT2020. Besides, "being disposed near the side" includes both a case of being disposed on the side and a case of being disposed in the vicinity of the side.

In this case, the first green color filters may be configured in a manner that the first green side vertex is disposed outside of a color gamut range of a pointer color showing a color gamut range of an object color in the xy chromaticity diagram, and the second green color filters are configured in a manner that the second green side vertex is disposed outside of the color gamut range of the pointer color showing the color gamut range of the object color in the xy chromaticity diagram. According to the configuration, compared with a case in which any one or both of the first green side vertex and the second green side vertex are disposed inside of the color gamut range of the pointer color, the color gamut range that can be reproduced by four types of color filters can be more easily expanded than the color gamut range of pointer color in the color gamut of the green side.

In the configuration in which the first green side vertex and the second green side vertex are disposed outside of the color gamut range of the pointer color in the xy chromaticity diagram, a first conversion portion may further included which converts, in the xy chromaticity diagram, a color closer to the green side vertex of the color gamut range of the color gamut standard BT2020 than a line which connects a first neighboring point and a second neighboring point to a color on the line which connects the first neighboring point and the second neighboring point. The first neighboring point is near the first green side vertex on the side connecting the green side vertex and the red side vertex of the color gamut range of the color gamut standard BT2020, and the second neighboring point is near the second green side vertex on the side connecting the green side vertex and the blue side vertex of the color gamut range of the color gamut standard BT2020. According to the configuration, in the color gamut range of the color gamut standard BT2020, the color of the triangular color gamut range formed by the first neighboring point, the second neighboring point and the green side vertex can be converted to the color on the line connecting the first neighboring point and the second neighboring point by the first conversion portion, and thus for the color gamut range of the color gamut standard BT2020, the color gamut range on the green side of a color gamut that cannot be reproduced by four types of color filters can be easily converted to the color that is relatively close in saturation.

In the configuration in which the first green side vertex and the second green side vertex are disposed outside of the color gamut range of the pointer color in the xy chromaticity diagram, preferably, a second conversion portion may be further included which converts, in the xy chromaticity diagram, a color of a triangular third color gamut range to a color of a triangular fourth color gamut range. The triangular third color gamut range is formed by a bottom side and the green side vertex of the color gamut range of the color gamut standard BT2020. The triangular fourth color gamut range is formed by the bottom side and a vertex on a line that connects a third neighboring point and a fourth neighboring point. The bottom side connects a point on the side connecting the green side vertex and the blue side vertex of the color gamut range of the color gamut standard BT2020 and a point on the side connecting the green side vertex and the red side vertex of the color gamut range of the color gamut standard BT2020, and is disposed outside of the color gamut range of the pointer color. The third neighboring point is near the first green side vertex on the side connecting the green side vertex and the red side vertex of the color gamut range of the color gamut standard BT2020, and the fourth neighboring point is near the second green side vertex on the side connecting the green side vertex and the blue side vertex of the color gamut range of the color gamut standard BT2020. According to the configuration, in the color gamut range of the color gamut standard BT2020, the color of the triangular color gamut range formed by the green side vertex and the bottom side can be converted to the color of the triangular color gamut range formed by the bottom side and the vertex on the line connecting the third neighboring point and the fourth neighboring point, and thus for the color gamut range of the color gamut standard BT2020, the green side range of the color gamut that cannot be reproduced by four types of color filters can be easily converted to the color that is relatively close in saturation. In addition, compared with a case in which the color of the triangular color gamut range is converted to the color on the line, color gradation can be expressed without being saturated with a specific color (losing the color gradation). In addition, because the bottom side is disposed outside of the color gamut range of pointer color, the color of the color gamut range of pointer color can be faithfully reproduced at least in the green side color gamut.

According to the disclosure, as described above, a reproducible color gamut range can be expanded while a decrease in image brightness is suppressed.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A display device, comprising:
   color filters, which comprise red color filters, blue color filters, first green color filters used for a first green, and second green color filters used for a second green having a hue closer to a blue side than the first green; and
   a display portion, in which the color filters are disposed, wherein first groups and second groups are disposed to line up regularly with each other in the display portion,
   each of the first groups comprises one red color filter, one blue color filter, one white color filter and one first green color filter,
   each of the second groups comprises one red color filter, one blue color filter, one white color filter and one second green color filter, and
   the second group is equal to the first group in number of the color filters, and different from the first group in a color filter combination in which the first green color filter and the second color filter are for transmitting different green light.

2. The display device according to claim 1, wherein the color filters further comprise white color filters, and the first groups and the second groups are disposed to line up regularly with each other in the display portion, the first groups include four types of color filters which are the red color filters, the blue color filters, the first green color filters and the white color filters, the second groups include four types of color filters which are the red color filters, the blue color filters, the second green color filters and the white color filters or which are the red color filters, the blue color filters, the first green color filters and the second green color filters.

3. The display device according to claim 1, wherein in the display portion, a number of the second groups is arranged to be equal to a number of the first groups or smaller than the number of the first groups so that a number of the second green color filters is at least equal to a number of the first green color filters or smaller than the number of the first green color filters.

4. The display device according to claim 1, wherein in an xy chromaticity diagram in which a chromaticity representing a mixed amount of red, blue and green is shown by a two-dimensional coordinate, the first green color filters are configured in a manner that a first green side vertex, which is on a green side of a triangular first color gamut range showing a color gamut that is able to be displayed by the red color filters, the blue color filters and the first green color filters, is disposed near a side that connects a green side vertex and a red side vertex of a color gamut range of a color gamut standard BT2020, and the second green color filters are configured in a manner that a second green side vertex, which is on a green side of a triangular second color gamut range showing a color gamut that is able to be displayed by the red color filters, the blue color filters and the second green color filters, is disposed near a side that connects the green side vertex and a blue side vertex of the color gamut range of the color gamut standard BT2020 in the xy chromaticity diagram.

5. The display device according to claim 4, wherein the first green color filters are configured in a manner that the first green side vertex is disposed outside of a color gamut range of a pointer color showing a color gamut range of an object color in the xy chromaticity diagram, and the second green color filters are configured in a manner that the second green side vertex is disposed outside of the color gamut range of the pointer color showing the color gamut range of the object color in the xy chromaticity diagram.

6. The display device according to claim 5, further comprising a first conversion part which converts, in the xy chromaticity diagram, a color closer to the green side vertex of the color gamut range of the color gamut standard BT2020 than a line which connects a first neighboring point and a second neighboring point to a color on the line which connects the first neighboring point and the second neighboring point, wherein the first neighboring point is near the first green side vertex on the side connecting the green side vertex and the red side vertex of the color gamut range of the color gamut standard BT2020, and the second neighboring point is near the second green side vertex on the side connecting the green side vertex and the blue side vertex of the color gamut range of the color gamut standard BT2020.

7. The display device according to claim 5, further comprising a second conversion part which converts, in the xy chromaticity diagram, a color of a triangular third color gamut range to a color of a triangular fourth color gamut range, wherein the triangular third color gamut range is formed by a bottom side and the green side vertex of the color gamut range of the color gamut standard BT2020, the triangular fourth color gamut range is formed by the bottom side and a vertex on a line that connects a third neighboring point and a fourth neighboring point, the bottom side connects a point on the side connecting the green side vertex and the blue side vertex of the color gamut range of the color gamut standard BT2020 and a point on the side connecting the green side vertex and the red side vertex of the color gamut range of the color gamut standard BT2020, and is disposed outside of the color gamut range of the pointer color, the third neighboring point is near the first green side vertex on the side connecting the green side vertex and the red side vertex of the color gamut range of the color gamut standard BT2020, and the fourth neighboring point is near the second green side vertex on the side connecting the green side vertex and the blue side vertex of the color gamut range of the color gamut standard BT2020.

* * * * *